(12) United States Patent
Ahn et al.

(10) Patent No.: US 6,381,838 B1
(45) Date of Patent: *May 7, 2002

(54) BGA PACKAGE AND METHOD OF MANUFACTURING THE SAME

(75) Inventors: Eun Chul Ahn; Woong Ky Ha; Young Min Lee, all of Cheonan (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/115,826

(22) Filed: Jul. 15, 1998

(30) Foreign Application Priority Data

Aug. 12, 1997 (KR) ............................. 97-38466

(51) Int. Cl.$^7$ ................................. H01K 3/22
(52) U.S. Cl. ............................ 29/848; 29/840
(58) Field of Search .................. 29/848, 852, 840

(56) References Cited

U.S. PATENT DOCUMENTS

| | | | | |
|---|---|---|---|---|
| 4,090,231 A | * | 5/1978 | Millard et al. | 361/433 |
| 4,109,377 A | * | 8/1978 | Blazick et al. | 29/626 |
| 4,396,936 A | * | 8/1983 | McIver et al. | 357/81 |
| 4,919,970 A | * | 4/1990 | Hoebener et al. | 427/96 |
| 5,189,261 A | * | 2/1993 | Alexander et al. | 174/263 |
| 5,427,865 A | * | 6/1995 | Mullen, III et al. | 428/559 |
| 5,463,191 A | * | 10/1995 | Bell et al. | 174/263 |
| 5,492,266 A | * | 2/1996 | Hoebener et al. | 228/248.1 |
| 5,561,322 A | * | 10/1996 | Wilson | 257/703 |
| 5,593,080 A | * | 1/1997 | Teshima et al. | 228/39 |
| 5,620,129 A | * | 4/1997 | Rogren | 228/56.3 |
| 5,759,269 A | * | 6/1998 | Cutting et al. | 118/213 |
| 5,803,340 A | * | 9/1998 | Yeh et al. | 228/56.3 |

FOREIGN PATENT DOCUMENTS

| | | | |
|---|---|---|---|
| JP | 2-58358 | | 2/1990 |
| JP | 4-177889 | * | 6/1992 |
| JP | 4-225552 | | 8/1992 |
| JP | 5-200974 | * | 8/1993 |
| JP | 5-304223 | | 11/1993 |

* cited by examiner

*Primary Examiner*—Peter Vo
*Assistant Examiner*—Sean P. Smith
(74) *Attorney, Agent, or Firm*—Volentine Francos, PLLC

(57) ABSTRACT

A BGA package includes a semiconductor chip, and a PCB having a board body, a plurality of circuit patterns, a plurality of signal via holes, a solder resist, and a plurality of thermal emissive vias. The thermal emissive vias are holes located beneath a chip attach area, and these holes are filled with metal having a low melting point. The metal prevents moisture from being absorbed, while effectively transferring heat. The semiconductor chip is attached to the chip attach area of the PCB and is connected to circuit patterns of the PCB with bonding wires. The bonding wires and the semiconductor chip are encapsulated to protect them from external environmental stress. Solder bumps are formed on circuit patterns of the PCB. The BGA package has advantages in that it prevents moisture from penetrating to the chip through the thermal emissive vias, and effectively transfers the heat generated by the chip to the outside.

2 Claims, 6 Drawing Sheets

BGA PACKAGE AND METHOD OF MANUFACTURING THE SAME

BACKGROUND OF THE INVENTION

1. Field of the Invention

The present invention generally relates to a Ball Grid Array (BGA) package and to a method of manufacturing the same. More particularly, the present invention relates to a BGA package which prevents moisture from penetrating to the semiconductor chip of the package and which effectively vents the heat generated by the chip.

2. Description of the Related Art

Semiconductor device packages are becoming faster, smaller, and thinner to meet the pressing demands for miniature and multi-functional electronic devices. A Ball Grid Array Package (hereinafter, referred to as a "BGA package") has been developed to meet these demands. The BGA package is a type of surface mount package which includes a printed circuit board (PCB), and solder balls (also referred to as solder bumps) instead of a lead frame for electrically connecting a semiconductor chip to the PCB. The BGA package has a high mounting density and thus employs a large number of I/O pins.

As described above, in the BGA package, a semiconductor chip is attached and electrically connected to the PCB. Circuit wiring patterns on a surface of the PCB are electrically connected to the semiconductor chip, which is mounted on the same surface of the PCB. The circuit wiring patterns are also electrically connected through signal via holes to external connections which are formed on the other surface of the PCB. Because the external connections are formed on the surface of the PCB which is opposed to that to which the semiconductor chip is mounted, the BGA package requires a mounting area that is smaller than that required by other conventional plastic packages. In conventional BGA packages, solder bumps serve as the external connections.

FIG. 1 is a cross-sectional view of a conventional BGA package and FIG. 2 is an enlarged view of thermal emissive via holes of a PCB of the package.

With reference to these figures, the conventional BGA package 100 has a semiconductor chip 20 electrically connected through a Printed Circuit Board (PCB) 10 to solder bumps 30. The solder bumps 30 serve as external connections for the BGA package 100.

The PCB 10 comprises a board body 19, and copper (Cu) pattern layers on an upper and a lower surface of the board body 19. The Cu pattern layers electrically connect the semiconductor chip 20 to the solder bumps 30. A plurality of signal via holes 14 penetrate the board body 19, in order to electrically connect the Cu pattern layer on the upper surface to the Cu pattern layer on the lower surface of the board body 19. Inner walls of the signal via holes 14 are plated with Cu.

The Cu pattern layer on the upper surface of the board body 19 comprises a chip attach area 60 and a plurality of circuit patterns 15. The chip attach area 60 refers to a region at which the semiconductor chip 20 is mounted to the PCB. The respective circuit patterns 15 are positioned around the chip attach area 60 and respective ends of the circuit patterns 15 are referred to as "board bonding pads ". The board bonding pads 17 are electrically connected to the semiconductor chip 20 by bonding wires 40.

The Cu pattern layer on the lower surface of the board body 19 comprises a plurality of solder ball pads 13, to which solder bumps 30 are attached, and circuit patterns 15, which are electrically connected to the solder ball pads 13. Via holes, which are formed underneath the chip attach area 60, are referred to as "thermal emissive via holes 62". The thermal emissive via holes 62 vent to the outside the heat generated during the operation of the semiconductor chip 20.

Both surfaces of the PCB 10 are coated with solder resist 16, except at locations corresponding to the board bonding pads 17 on the upper surface and the solder ball pads 13 on the lower surface. During the coating process, the thermal emissive via holes 62 are filled with the solder resist 16, as shown in FIG. 2.

After that, the upper surface of the PCB 10 is encapsulated with molding compound, such as a thermosetting resin, to protect the semiconductor chip 20 and the circuit patterns 15 from external environmental stress, whereby a package body 50 is formed. After attaching solder balls to the solder ball pads 13 of the lower surface of the PCB 10, the solder bumps 30 are formed by a reflow soldering process.

The conventional BGA package described above has the following problems. First, the PCB is extremely hygroscopic. Therefore, the BGA package absorbs moisture much more readily than do conventional packages using a metal lead frame.

Moisture is absorbed into the BGA package 100 through two routes: an absorption through the board body 19 and an absorption through the thermal emissive via holes 62. The amount of absorption through the board body 19 depends on the physical properties of the material of the board body 19. Therefore, problems caused by the absorption of the moisture through the board body 19 may be overcome by selecting a suitable material for the board body.

The thermal emissive via holes 62 provide the second route because the solder resist 16 with which they are filled is also extremely hygroscopic. Therefore, moisture can flow to the semiconductor chip 20 through the thermal emissive via holes 62. Such moisture affects the reliability of the package more seriously than the moisture absorbed through the board body 19.

The second problem is that although the thermal emissive via holes 62 are provided for transferring heat generated by the chip 20 to the outside of the package 100, the rate of heat transfer through the thermal emissive via holes 62 is considerably low.

More specifically, as shown in FIG. 2, the chip attach area 60 is relatively large and comprises a Cu layer 12. The thermal emissive via holes 62 are formed underneath this relatively large chip attach area 60, but the solder resist 16 filling the thermal emissive holes 62 has a low coefficient of thermal conductivity. Therefore, most of the heat is drawn by the Cu layer 12 at the chip attach area 60. The heat transfer rate is thus dictated in large part by the area of the Cu layer 12 at the chip attach area 60.

A third problem is that because the PCB is coated with solder resist 16, the viscosity of the solder resist 16 prevents the thermal emissive via holes 62 from being completely filled. In other words, the solder resist 16 may be left with voids 64. The voids 64 may cause the PCB to crack during reliability tests, such as a burn-in test which is carried out under high temperature and pressure after the BGA package 100 is manufactured.

SUMMARY OF THE INVENTION

Accordingly, an object of the present invention is to provide a BGA package which prevents moisture from penetrating to the chip through the thermal emissive via holes, and which possesses a comparatively high thermal emission property.

Another object of the present invention is to provide a BGA package having thermal emissive vias which are free of voids, and therefore is resistant to cracking.

The foregoing objects of the present invention are achieved by a BGA package having thermal emissive via holes filled with metal having a low melting point, excellent thermal conductivity and which is not highly hygroscopic, and by a method of manufacturing the same.

In a process of manufacturing a PCB of the BGA package of the present invention, the thermal emissive via holes are filled with metal having a low melting point while bottom ends of the thermal emissive via holes are closed by a coating of solder resist formed on the lower surface of a board body of the PCB. Metal paste, which comprises the metal having a low melting point, is forced through open top ends of the thermal emissive via holes using a screen-printing process, until the thermal emissive via holes are filled with the metal paste. A reflow soldering process causes the paste to completely fill the via holes.

Alternatively, instead of the metal paste, metal balls which have a low melting point, are positioned on the top ends of the thermal emissive via holes. The thermal emissive via holes are filled with the metal by carrying out a reflow soldering process. After that, solder resist is applied to the upper surface of the board body of the PCB.

After the PCB is produced, a semiconductor chip is attached to the PCB, chip pads of the semiconductor chip are connected to wiring patterns on one surface of the PCB with bonding wires, the bonding wires and the semiconductor chip are encapsulated to protect them from external environmental stress, and solder bumps are formed on wiring patterns on the other surface of the PCB.

BRIEF DESCRIPTION OF THE DRAWINGS

These and various other objects, features and advantages of the present invention will be described with reference to the accompanying drawings, wherein like reference numerals designate like structural elements, and in which.

DETAILED DESCRIPTION OF THE PREFERRED EMBODIMENTS

Preferred embodiments of the present invention will now be described with reference to the accompanying drawings.

Figure 1:
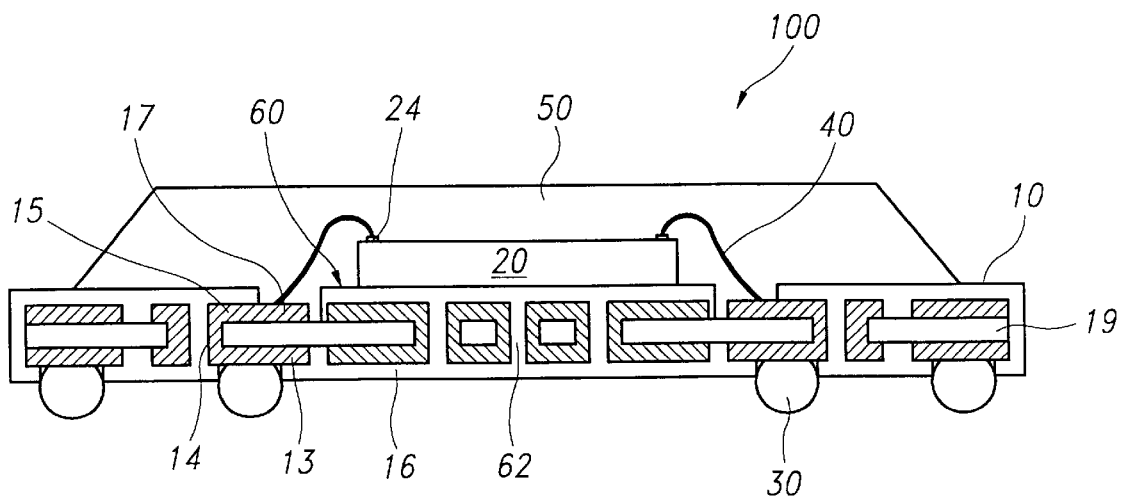
FIG. 1 is a cross-sectional view of a conventional BGA package.
Figure 2:
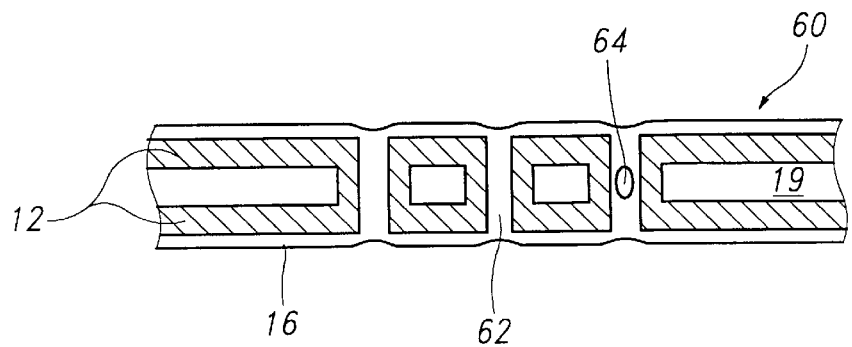
FIG. 2 is an enlarged cross-sectional view of a thermal emissive via hole of a PCB of the package shown in FIG. 1.
Figure 3:
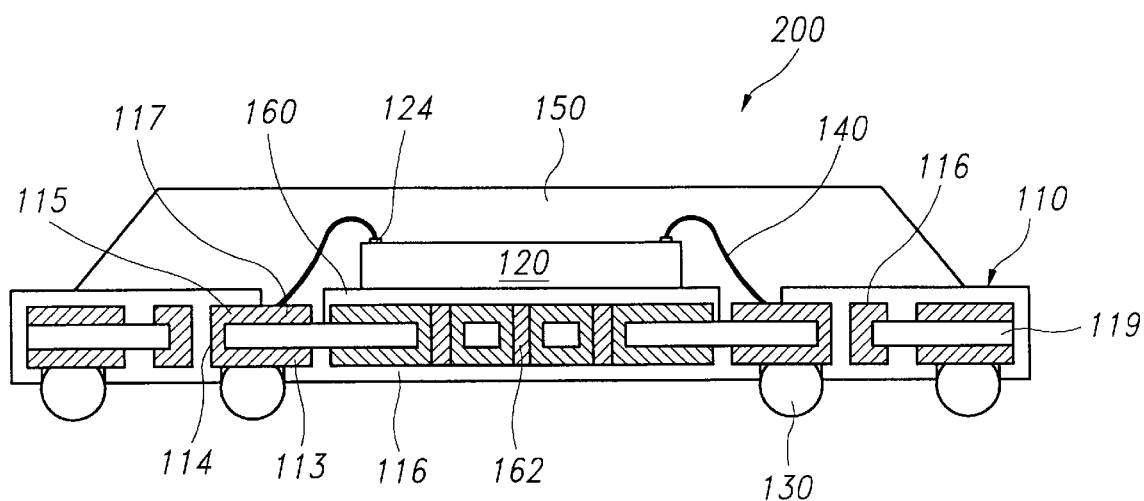
FIG. 3 is a cross-sectional view of a BGA package according to the present invention.
Figure 4:
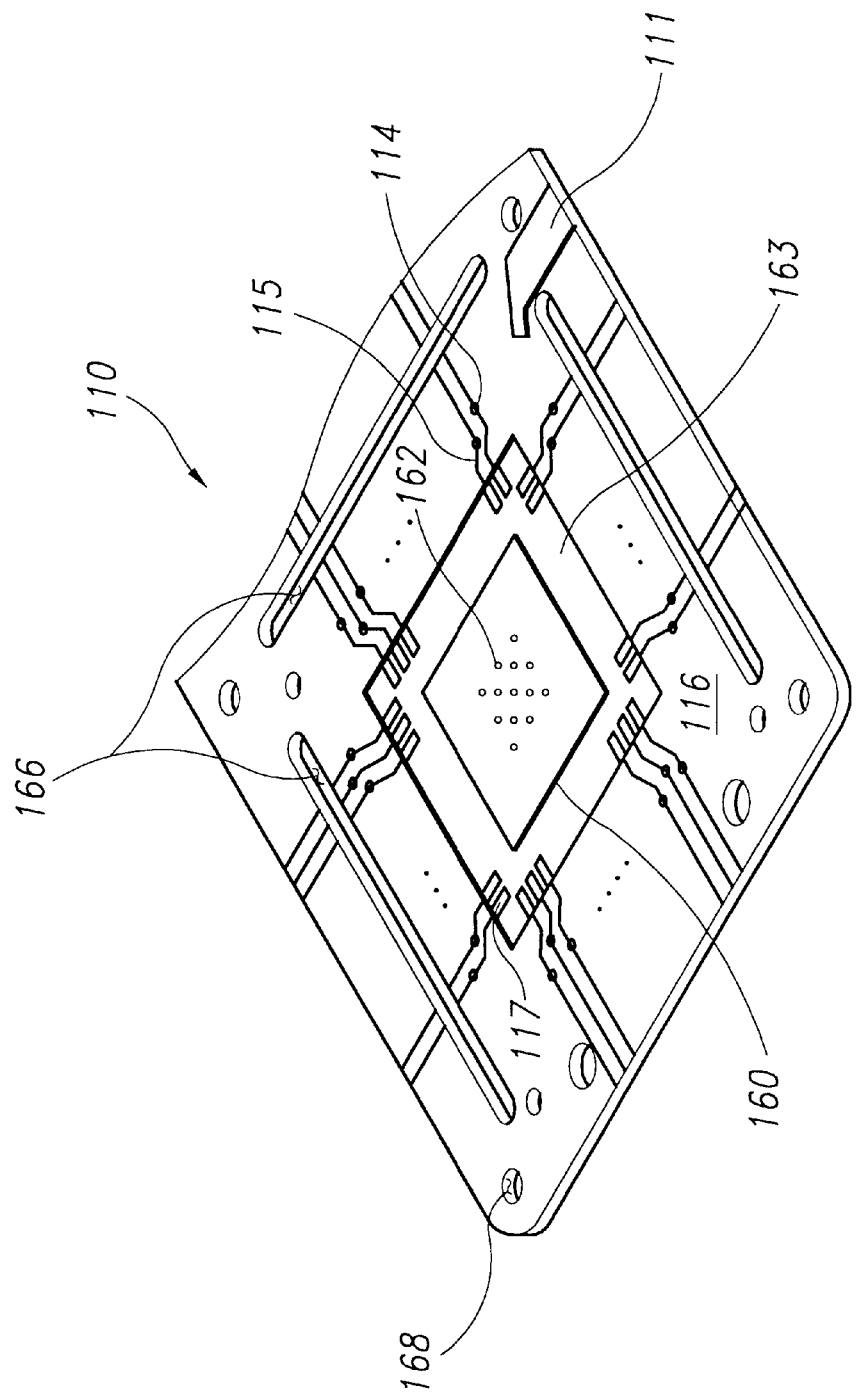
FIG. 4 is a perspective view of a PCB of the BGA package according to the present invention.
Figure 5:
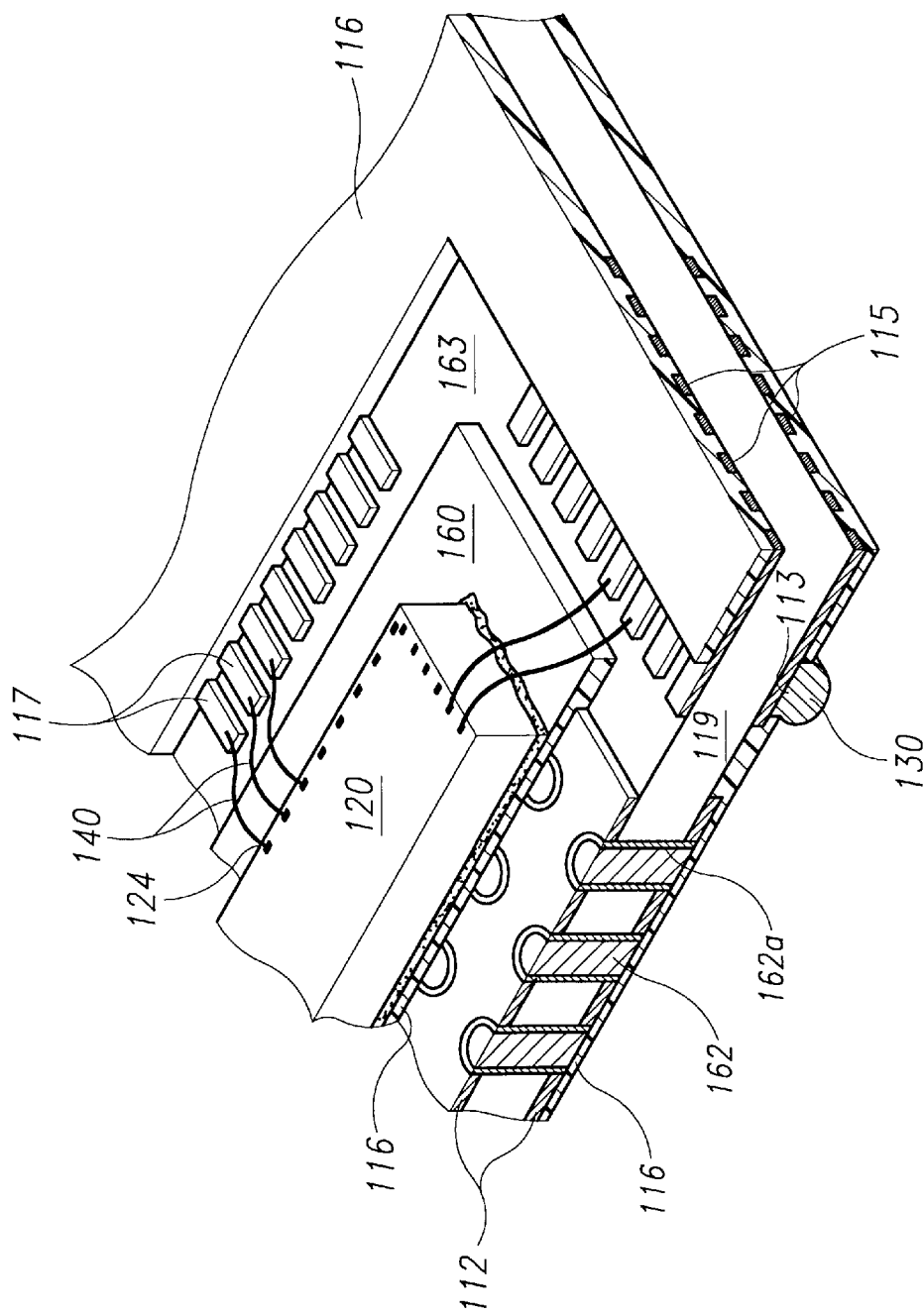
FIG. 5 is a partially cut-away enlarged perspective view of the BGA package according to the present invention, taken at the chip attach area.

With reference to FIG. 3 through FIG. 5, a BGA package 200 according to the present invention comprises a PCB 110 having a chip attach area 160 and circuit patterns 115, a semiconductor chip 120 which is attached to the chip attach area 160, a plurality of electrical connections, such as bonding wires 140, electrically connecting the semiconductor chip 120 to the circuit patterns 115, and solder bumps 130. A package body 150 is formed by encapsulating the semiconductor chip 120 and the bonding wires 140. The solder bumps 130 serve as the external connections of the BGA package 200.

The PCB 110 comprises a board body 119 and copper (Cu) pattern layers on an upper and a lower surface of the board body 119. More specifically, the board body 119 is made of Glass-Epoxy Resin or BT Resin (Bismaleimide Triazine Resin), and Cu foil is attached to the upper and the lower surfaces of the resin board body 119. A Cu pattern layer is formed by removing selected portions of the Cu foil. The Cu pattern layer of the upper surface of the board body 119 comprises the chip attach area 160, to which the semiconductor chip 120 is attached, and a plurality of the circuit patterns 115 disposed around the chip attach area 160. Respective ends of the circuit patterns 115, which are closest to the chip attach area 160, form board bonding pads 117 which are electrically connected to chip pads 124 of the semiconductor chip 120.

The Cu pattern layer on the lower surface of the board body 119 comprises solder ball pads 113, to which the solder bumps 130 are attached, and circuit patterns 115 which are electrically connected to the solder ball pads 113. Signal via holes 114, which electrically connect the circuit patterns at the upper surface of the PCB to the circuit patterns at the lower surface, extend through the board body 119. Inner walls of the signal via holes 114 are plated with Cu. Therefore, the circuit patterns 115 on the upper and lower surfaces of the board body 119, the board bonding pads 117, and the solder ball pads 113 are electrically connected to one another.

Thermal emissive via holes 162a for transferring heat to the outside during the operation of the semiconductor chip 120 are located underneath the chip attach area 160. The thermal emissive via holes 162a are filled with metal having a low melting point. Hereinafter, the thermal emissive via holes 162a which are filled with the metal will be referred to as "thermal emissive vias 162".

In order to protect the board body 119 and the Cu pattern layers on the upper and lower surfaces of the board 119, the entire board body 119 is coated with solder resist 116 except at locations corresponding to the board bonding pads 117 on the upper surface of the board body 119 and the solder ball pads 113 on the lower surface.

The lower surface of the semiconductor chip 120 is attached at the chip attach area 160 of the PCB 110.

The chip pads 124, which are formed on the active upper surface of the semiconductor chip 120, are connected to the board bonding pads 117 by bonding wires 140. After the bonding wires 140 are attached, a package body 150 is formed by encapsulating the upper surface of the PCB 110 with thermosetting resin, so as to protect the semiconductor chip 120 and the circuit patterns 115 from external environmental stress. And, after attaching the solder balls to the solder ball pads 113 of the PCB 110, solder bumps 130 are formed by a reflow soldering process.

The PCB 110 of the present invention may be manufactured in strips, like the lead frame strip used for manufacturing the lead frames of conventional plastic packages. A plurality of scribing slots 166 are formed on a PCB strip. The slots are used for separating the PCB strip after the assembly process to produce individual ones of the BGA package bodies. Three scribing slots 166 are formed in each end portion of the PCB strip, while four scribing slots 166 are formed in the interior portions of the PCB strip (i.e., between the end potions), two scribing slots 166 along the long opposing sides of the strip and two scribing slots 166 across the short opposing sides of the strip. FIG. 4 shows an end portion of the PCB strip in which the three scribing slots 166 are formed.

A gate 111 through which the molding compound is injected is formed in an edge of the PCB strip, and a plurality of sprocket holes 168 by which the PCB strip is transferred are spaced from one another by a predetermined distance along the two long opposing sides of the strip.

With specific reference to FIG. 5, the chip attach area 160, beneath which the thermal emissive vias 162 are formed, will be now be described in more detail. Cu foil 112 extends widely over the upper and the lower surfaces of the board body 119. A plurality of the thermal emissive via holes 162a penetrate the Cu foil 112 at both the upper and the lower surface of the board body 119. The thermal emissive via holes 162a are filled with metal having a low melting point to thereby form the thermal emissive vias 162. Then, the upper and the lower surface of the board body 119 are coated with solder resist 116. Reference numeral "163" designates a region of the PCB just outside of the chip attach area 160. The solder resist 116 does not coat the region 163 of the PCB so that the board bonding pads 117 are left exposed. The chip pads 124 of the semiconductor chip 120, which is mounted on the chip attach area 160, are electrically connected to the board bonding pads 117 by bonding wires 140.

The process of filling the thermal emissive via holes with metal having a low melting point to form the thermal emissive vias, will next be described with reference to FIG. 6A through FIG. 6E.

Figure 6A:
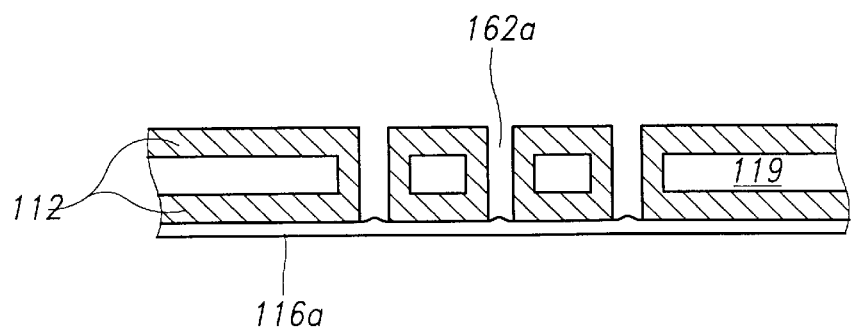
FIG. 6A is a cross-sectional view of the PCB, showing solder resist coated on the lower surface thereof.

Referring first to FIG. 6A, the Cu foil 112 is attached to the upper and lower surfaces of the board body 119, and a plurality of the thermal emissive via holes 162a are formed in a portion of the board body 119 corresponding to the chip attach area. Inner walls of the board body 119 defining the thermal emissive via holes 162a are non-electrically plated with Cu. After the thermal emissive via holes 162a are formed, the Cu foil 112 on the lower surface of the board body 119 is coated with solder resist 116a.

The thermal emissive via holes 162a are formed after selected portions of the Cu foil are removed to form the Cu pattern layers on the upper and lower surfaces of the board body 119. In addition, the thermal emissive via holes 162a are preferably formed simultaneously with the signal via holes (114 in FIG. 3).

Figure 6B:
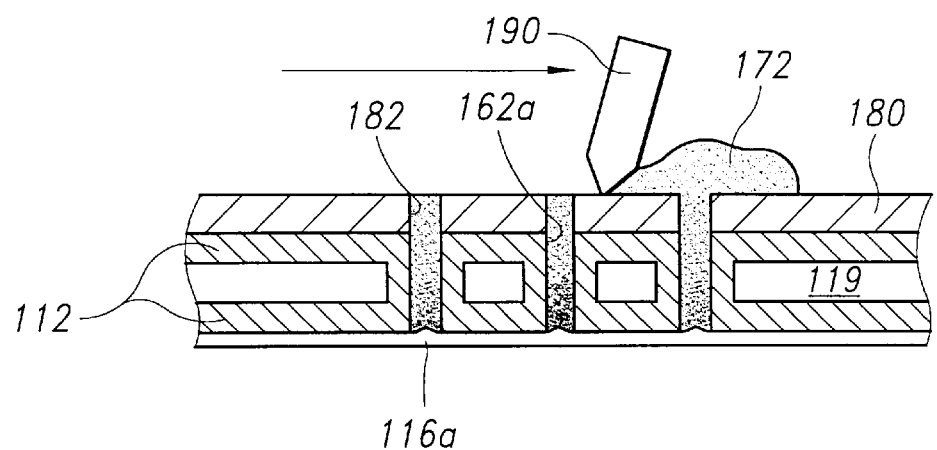
FIG. 6B is another cross-sectional view of the PCB, this time showing metal paste on the upper surface thereof being forced into the thermal emissive via holes using a screen printing process.

As shown in FIG. 6B, a mask 180 having a plurality of holes 182, arrayed in a pattern corresponding to that of the thermal emissive via holes 162a, is placed on the upper surface of the board body 119 with the holes 182, 162a aligned with one another, respectively. Metal paste 172 is in turn placed on the mask 180, and is forced by a squeegee 190 through the holes 182 of the mask 180 and into the thermal emissive via holes 162a. At this time, the solder resist 116a which covers the lower surface of the board body 119 prevents the metal paste 172 from flowing through the lower ends of the thermal emissive via holes 162a.

Figure 6C:
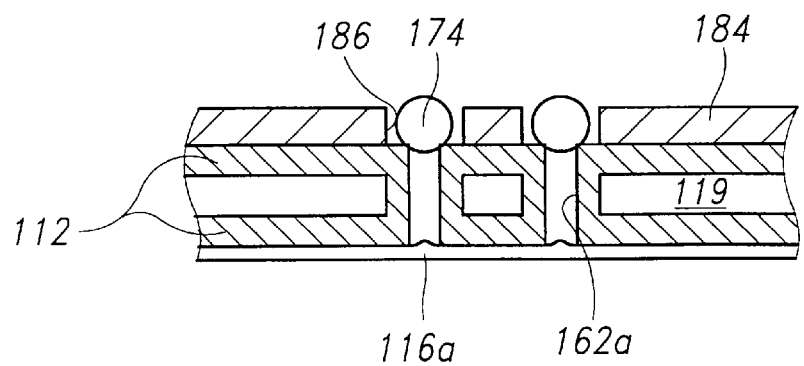
FIG. 6C is another cross-sectional view of the PCB, showing the aligning of metal balls on top of the thermal emissive via holes.
Figure 6D:
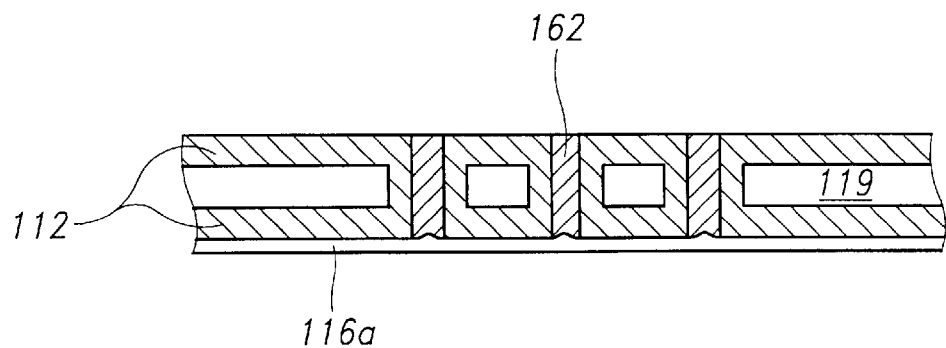
FIG. 6D is still another cross-sectional view of the PCB, this time showing the thermal emissive via holes filled with the metal.

Next, referring to FIG. 6D, the mask 180 is removed from the board body 119 and the metal paste 172, which now fills the thermal emissive via holes 162a, is hardened in place in the holes 162a after carrying out a reflow soldering process. The metal now completely fills the holes 162a. What is meant by the term "completely" is that the metal occupies the entire space of the holes 162a and is substantially free of voids.

The metal paste 172 comprises a metal having an excellent coefficient of thermal conductivity and high resistance to moisture. And, the metal paste should comprise a metal or alloy having a low melting point of 500° C. or less. This is because the metal paste 172 must be melted to fill the thermal emissive via holes 162a. If the metal of the paste were to have a high melting point, it could damage the board body 119. Therefore, it is important to use a metal having a melting point at which the board body 119 will not be damaged. For example, a metal having a low melting point such as tin (Sn) or solder may be used in the metal paste 172.

Figure 6E:
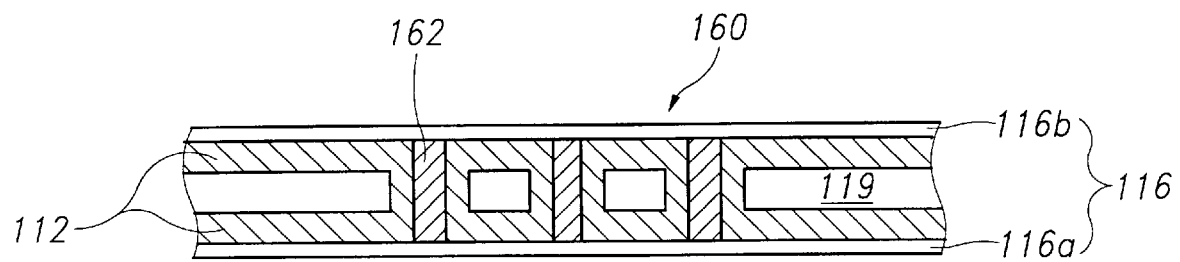
FIG. 6E is a cross-sectional view of the PCB, showing the upper surface thereof coated with solder resist.

After the thermal emissive vias 162 are formed, the upper surface of the board body 119 is coated with solder resist 116b, as shown in FIG. 6E.

In another embodiment of the present invention as shown in FIG. 6C, metal balls 174, which have a low melting point, are used to form the thermal emissive vias 162 instead of the metal paste 172. The metal balls 174 are placed in holes 186 of a mask 184 to align them with the thermal emissive via holes 162a. After the mask 184 is removed, the thermal emissive via holes 162a are filled by melting the metal balls 174 using the reflow soldering process to form the thermal emissive vias 162.

After the thermal emissive vias 162 are formed, the semiconductor chip 120 is attached to the chip attach area 160 of the PCB 110, the chip pads 124 of the semiconductor chip 120 are connected to the board bonding pads 117 of the PCB 110 with the bonding wires 140, the bonding wires 140 and the semiconductor chip 120 are encapsulated to protect them from external environmental stress, and the solder bumps 130 are formed on the solder ball pads 113 of the PCB 110.

In sum, the thermal emissive via holes of the present invention are filled with metal having a low melting point, instead of with solder resist. Therefore, the thermal emissive via holes of the present invention can prevent the package body from absorbing moisture through the thermal emissive via holes, and the present invention exhibits an improved thermal emission property.

Further, because the thermal emissive via holes of the present invention are filled with metal using a screen printing or reflow soldering process, voids are prevented from forming inside the thermal emissive vias.

Although preferred embodiments of the present invention have been described in detail hereinabove, many variations and/or modifications of the basic inventive concepts taught will appear to those skilled in the art. It is thus clear that all such variations and/or modifications fall within the true spirit and scope of the present invention as defined by the appended claims.

What is claimed is:

1. A method of manufacturing a ball grid array package, said method comprising the steps of:

(a) providing an intermediate product of a printed circuit board comprising a board body having an upper surface, and a lower surface, a chip attach area at the upper surface of said board body, a plurality of circuit patterns on the upper and lower surfaces of said board body, the circuit patterns on said upper surface being disposed around said chip attach area, and the circuit patterns on said lower surface terminating at solder ball pads, a plurality of signal vias extending through said board body and connecting the circuit patterns on the upper surface of said board body to the circuit patterns on said lower surface of the board body, and a plurality of thermal emissive via holes extending through said board body and opening at said chip attach area;

(b) coating the lower surface of said board body with solder resist except at locations corresponding to the solder ball pads;

(c) placing a mask, having holes, arrayed in a pattern matching that of said thermal emissive holes, on the upper surface of said board body with the holes in the mask aligned with the thermal emissive via holes;

(d) providing balls of metal in the holes in the mask to align the metal balls with the thermal emissive via holes;

(e) filling said thermal emissive via holes with metal by subsequently subjecting the metal balls to a reflow soldering process;

(f) after the thermal emissive via holes are filled, coating the upper surface of said board body with solder resist except at locations corresponding to respective ends of the circuit patterns which lie adjacent to said chip attach area and thereby covering the thermal emissive via holes filled with the metal with solder resist;

(g) attaching a semiconductor chip having a plurality of chip pads to said chip attach area;

(h) connecting the chip pads of the semiconductor chip to the circuit patterns on the upper surface of said board body with electrical connectors;

(i) encapsulating the semiconductor chip and the electrical connectors; and (j) attaching solder balls to said solder ball pads, wherein said step (b) is carried out prior to at least said steps (c) through (e).

2. A method of manufacturing a ball grid array package as claimed in claim 1, wherein said providing balls of metal in the holes of the mask comprises providing balls of metal having a low melting point in the holes of the mask.

* * * * *